(12) United States Patent
Wood et al.

(10) Patent No.: US 7,168,911 B1
(45) Date of Patent: Jan. 30, 2007

(54) SEMICONDUCTOR HANDLING ROBOT WITH IMPROVED PADDLE-TYPE END EFFECTOR

(75) Inventors: Eric R. Wood, Mesa, AZ (US); Richard Crabb, Phoenix, AZ (US); James A. Alexander, Tempe, AZ (US)

(73) Assignee: ASM America, Inc., Phoenix, AZ (US)

( * ) Notice: Subject to any disclaimer, the term of this patent is extended or adjusted under 35 U.S.C. 154(b) by 577 days.

(21) Appl. No.: 10/437,207

(22) Filed: May 13, 2003

Related U.S. Application Data

(63) Continuation of application No. 09/709,782, filed on Nov. 7, 2000, now Pat. No. 6,585,478.

(51) Int. Cl.
*F26B 3/08* (2006.01)

(52) U.S. Cl. ............................. 414/804; 414/217

(58) Field of Classification Search ............ 414/217, 414/217.1, 935, 939, 940, 804, 80, 806
See application file for complete search history.

(56) References Cited

U.S. PATENT DOCUMENTS

| | | |
|---|---|---|
| 4,009,785 A | 3/1977 | Thayes |
| 4,410,209 A | 10/1983 | Trapani |
| 4,566,726 A | 1/1986 | Correnti et al. |
| 4,601,627 A | 7/1986 | Oka et al. |
| 4,775,281 A | 10/1988 | Prentakis |
| 4,875,824 A | 10/1989 | Moe et al. |
| 5,080,549 A | 1/1992 | Goodwin et al. |
| 5,100,502 A | 3/1992 | Murdoch et al. |
| 5,147,175 A | 9/1992 | Tada |
| 5,286,296 A | 2/1994 | Sato et al. |
| 5,382,128 A | 1/1995 | Takahashi et al. |
| 5,439,547 A | 8/1995 | Kumagai |
| 5,474,410 A | 12/1995 | Ozawa et al. |
| 5,479,108 A | 12/1995 | Cheng |
| 5,562,387 A | 10/1996 | Ishii et al. |
| 5,636,963 A | 6/1997 | Haraguchi et al. |
| 5,647,626 A | 7/1997 | Chen et al. |
| 5,647,724 A | 7/1997 | Davis et al. |
| 5,669,644 A | 9/1997 | Kaihotsu et al. |
| 5,697,749 A | 12/1997 | Iwabuchi et al. |
| 5,755,469 A | 5/1998 | Choi et al. |
| 5,789,878 A | 8/1998 | Kroeker et al. |
| 5,900,105 A | 5/1999 | Toshima |
| 5,950,495 A | 9/1999 | Ogawa et al. |
| 5,993,141 A | 11/1999 | Wytman |
| 6,048,162 A | 4/2000 | Moslehi |
| 6,073,366 A | 6/2000 | Aswad |
| 6,224,319 B1 | 5/2001 | Velikov et al. |

FOREIGN PATENT DOCUMENTS

| | | |
|---|---|---|
| EP | 1139393 | 4/2001 |
| WO | WO 99/18601 | 4/1999 |

*Primary Examiner*—Charles A. Fox
(74) *Attorney, Agent, or Firm*—Knobbe Martens Olson & Bear LLP

(57) ABSTRACT

A robotic semiconductor handling system includes two robot arms for transferring substrates between processing, cooling, and storage stations. The first robot arm has a paddle-type end effector adapted such that it can support one substrate at a primary location as well as a second substrate at a secondary staging location. The second robot arm is a Bernoulli-style wand that transfers a substrate from the primary location to the secondary one, and transfers substrates from either location to the process chamber. The use of the dual-location paddle allows for a significant reduction in cycle-time over a single paddle location and a Bernoulli wand system.

15 Claims, 6 Drawing Sheets

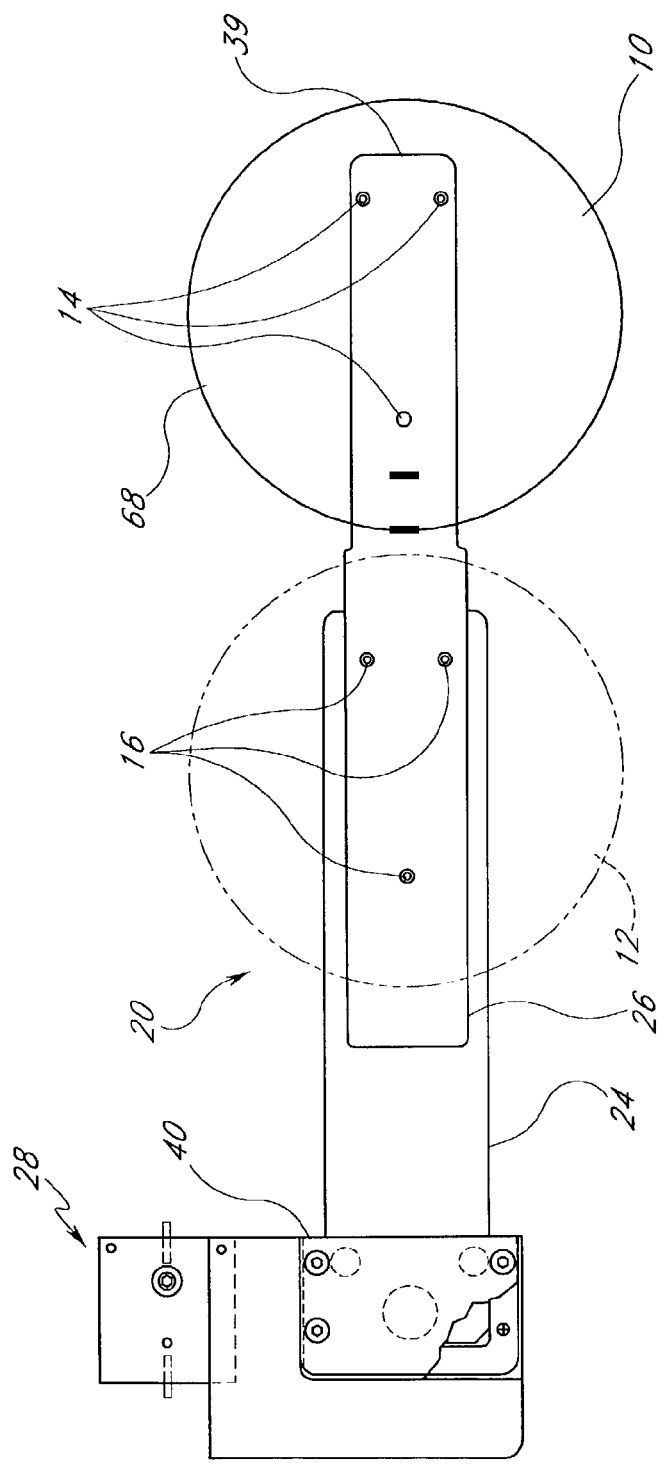
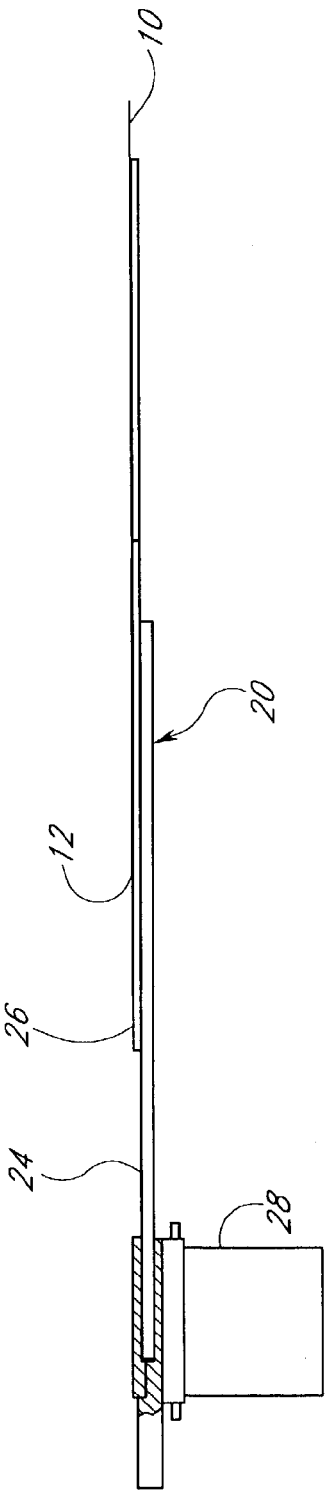
FIG.2
FIG.3

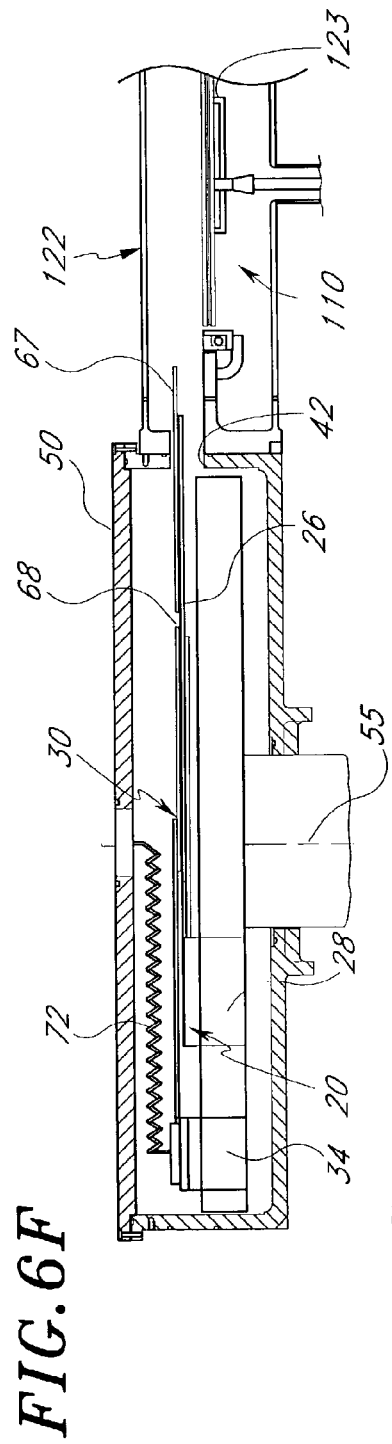
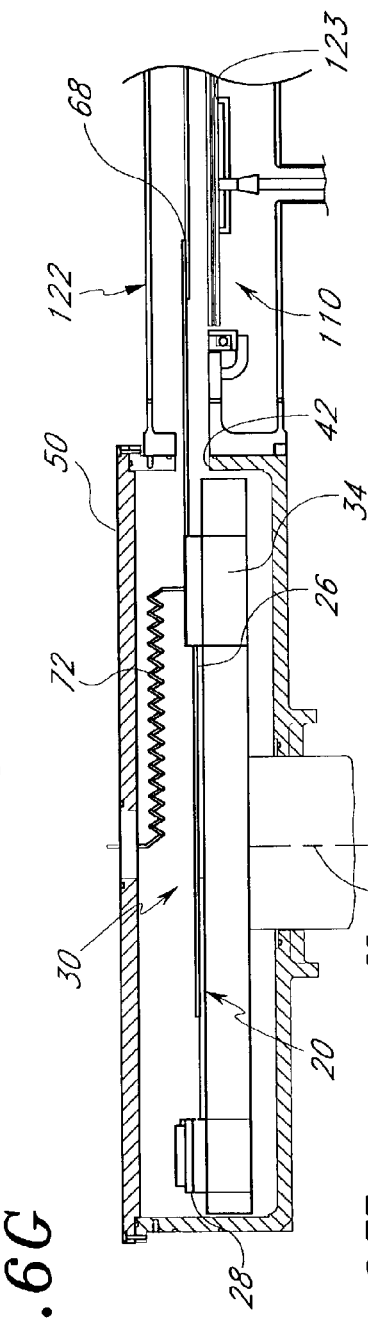
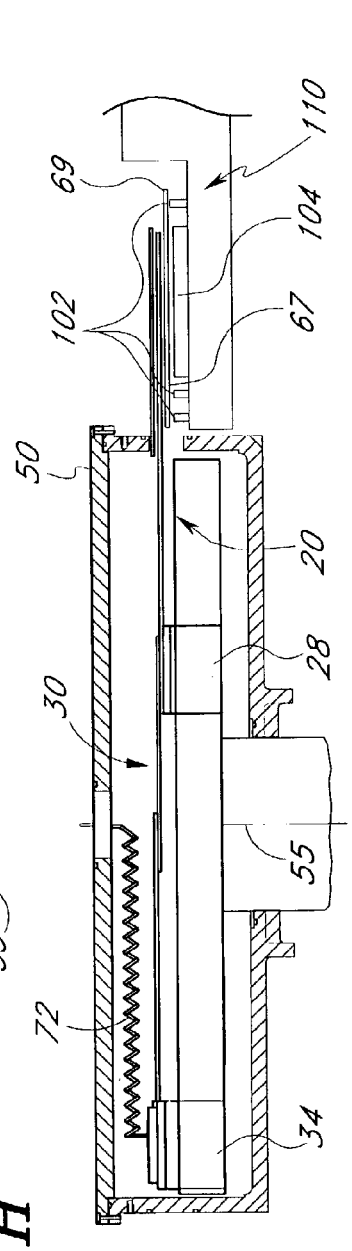
FIG.6F
FIG.6G
FIG.6H

SEMICONDUCTOR HANDLING ROBOT WITH IMPROVED PADDLE-TYPE END EFFECTOR

RELATED APPLICATION

This is a continuation of U.S. patent application Ser. No. 09/709,782, filed Nov. 7, 2000, now U.S. Pat. No. 6,585,478.

BACKGROUND OF THE INVENTION

1. Field of the Invention

The invention relates in general to a system and method of substrate handling in semiconductor processing, and specifically to a robot arm with primary and secondary substrate locations on a paddle-type end effector.

2. Description of the Related Art

In the processing of semiconductor devices, such as transistors, diodes, and integrated circuits, a plurality of such devices are fabricated simultaneously on a thin slice of semiconductor material, termed a substrate or wafer. Such wafers are extremely brittle, and easily contaminated. During manufacturing of semiconductor integrated circuits, therefore, care must be taken to avoid physical damage and particulate contamination to the wafers.

Various systems are known for handling wafers within semiconductor processing systems. The particular application or environment from which the wafer is lifted often determines the type of pickup device. One class of pickup devices, known as Bernoulli wands are typically used for high temperature applications. Bernoulli wands utilize jets of gas downward from the wand toward the wafer to create a region of low pressure above the wafer, therefore lifting it. The advantage being that the hot wafer need not contact the pickup wand, except perhaps at one or more small locators depending from the wand. Such a Bernoulli wand is shown in U.S. Pat. No. 5,080,549 to Goodwin, et al.

Another type of wafer pickup device is a simple paddle which relies on friction due to gravity between wafer support surfaces and the back of the wafer. In a variation of that, the paddle is augmented with a vacuum to hold the wafers on the paddles.

U.S. Pat. No. 5,135,349 to Lorenz, et al., discloses a robotic handling system utilizing two paddle style pickups mounted on a common rotating base. Both pickups are adapted to extend linearly away from one another to speed up handling of wafers within the processing system. Again, the paddles are augmented with a vacuum generated through a plurality of holes in an end effector portion of each paddle.

In a more recent method of wafer handling, a dual-arm transfer assembly is provided with one arm having a spatula-type end effector, and the other a Bernoulli wand end effector. This method uses the spatula to retrieve or deposit a wafer from or to a cassette. Prior to insertion into the process chamber for deposition, the wafer is "handed off" to the Bernoulli wand, which then places the wafer into the process chamber. Following processing, the Bernoulli wand retrieves the wafer from the process chamber and retracts it into the wafer handling chamber, where the wafer is deposited in a cooling station. When sufficiently cool, the spatula is used to return the wafer to the cassette in the load lock. This sequence of placing/retrieving a wafer from the cool station and returning it to it's cassette, fetching the next wafer and returning to the Bernoulli hand-off position is relatively short, but yet reducing the time is desirable. These robotic motions are typically conducted during the etch cycle where the process chamber is not available to process wafers. As improvements are made in process technology, the etch cycle may be significantly shortened or eliminated. Hence, there is a need for a system that reduces wafer handling time.

SUMMARY OF THE INVENTION

It is therefore one object of the present invention to provide a first robot arm with a paddle-type end effector capable of holding two substrates at primary and secondary locations. This arm is preferably to be used in conjunction with a second robot arm having a Bernoulli wand end effector, both of which are actors in a pivoting linear robot. The secondary location is effectively a staging area for a wafer prior to its being processed. By using the Bernoulli wand to retrieve a hot, processed wafer, placing that wafer on the cooling station, and having another wafer staged on the secondary location on the paddle, the loading time of the next wafer into the process chamber may be significantly reduced. This effectively results in a significant improvement in throughput for the overall wafer processing system.

The two robot arms are mounted such that they can translate linearly within a wafer handler of the semiconductor processing system. A wafer can be moved in and out of a cassette of many wafers staged in a load lock chamber. The cassette or the paddle may be independently vertically movable such that the paddle can be positioned underneath a wafer and lift it from the cassette.

In order to transfer a wafer from the primary location to the secondary location, the first robot arm returns to its "home" position which places the wafer on the primary location directly below the Bernoulli wand. The Bernoulli wand then lifts the wafer from the paddle by initiating the flow of gas through the Bernoulli wand, creating a low pressure region above the wafer, and thus lifting it. Once the wafer has been lifted by the Bernoulli wand, the first robot arm translates forward to a position such that the secondary wafer location is directly below the wafer being held by the Bernoulli wand. The wafer is then deposited onto the paddle at the secondary position by stopping the flow of gas through the Bernoulli wand. The paddle is then retracted to the "home" position. Note that this is done while a wafer, previously deposited in the process chamber, is processing so as not add to the overall cycle time.

The Bernoulli wand then translates forward and into the process chamber in order to retrieve a "hot" processed wafer. The "hot" wafer is lifted by the Bernoulli wand as described above, and the wand is then retracted to its "home" position. Assuming the paddle is made of material which can handle the heat, such as quartz, the hot wafer is dropped on the paddle at the primary position. Next, the paddle extends toward the process chamber to the point which the "cold" wafer in position two is under the wand. Then the wand lifts the "cold" wafer and the paddle retracts to its home position. The wand then places the "cold" wafer in the reactor and retracts to its "home" position.

The wafer handler then rotates to face the cooling station where the "hot wafer is. deposited for cooling. The handler can then be rotated to retrieve another "cold" wafer from the load lock for transfer to the second position on the paddle. The first robot arm can be used to transfer cooled wafers to the load lock while waiting for a wafer to be processed.

In an alternate sequence, a "hot" wafer can be deposited directly in a cooling station, and then an unprocessed wafer transferred to the reactor. That leaves the reactor empty longer than in the first described systems, but the paddle is not subjected to the hot wafer. Wafers can be transferred from a cooling station to the load lock while a wafer is in the reactor.

BRIEF DESCRIPTION OF DRAWINGS

FIG. 2 is a top view of the dual-location robot arm of the present invention.

FIG. 3 is a side view of the dual-location robot arm of the present invention.

FIGS. 6A–6H are sequential drawings of a cycle of transferring substrates between the various stations.

DETAILED DESCRIPTION OF THE PREFERRED EMBODIMENT

Figure 1:
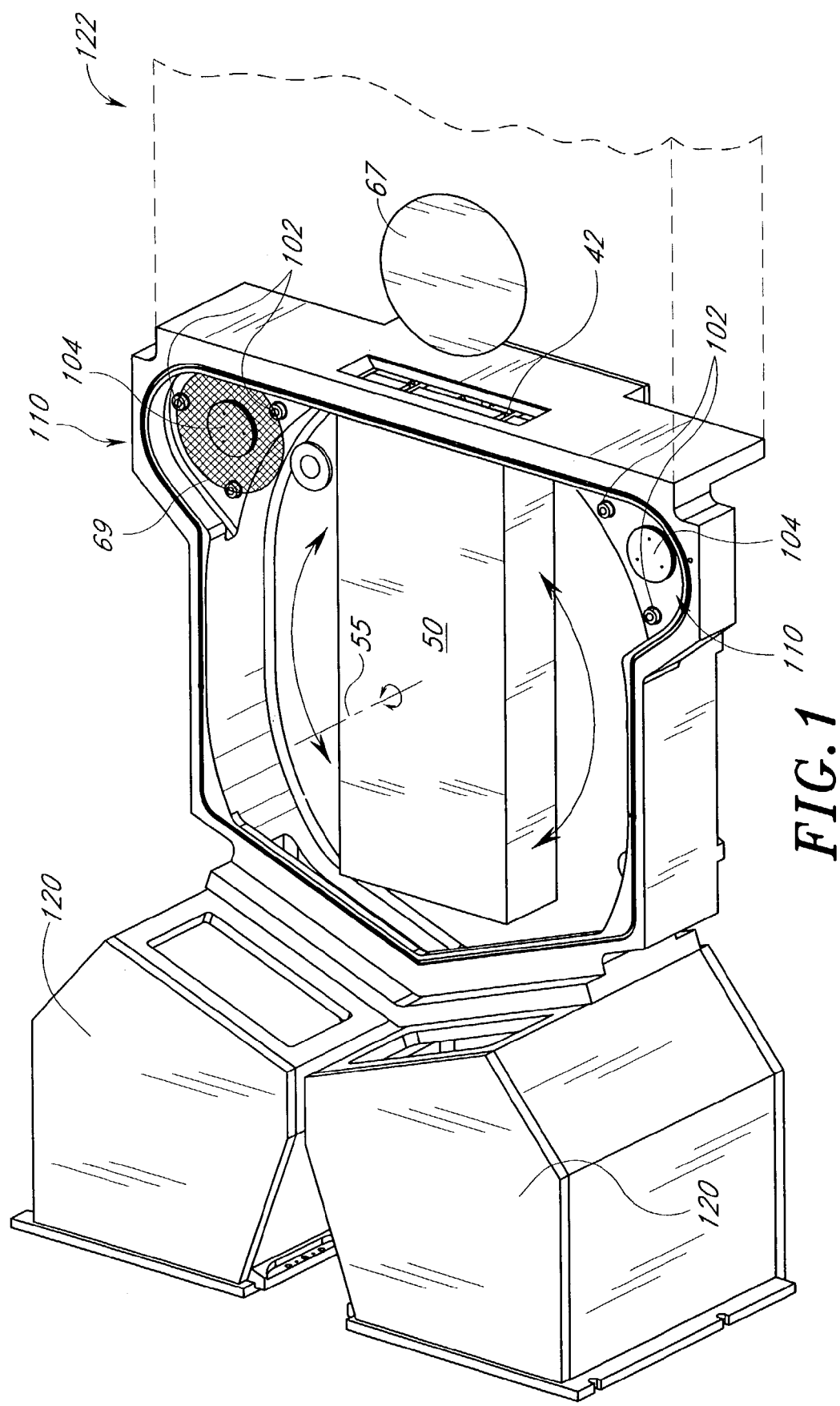
FIG. 1 is an isometric view of the wafer handling system.
Figure 4:
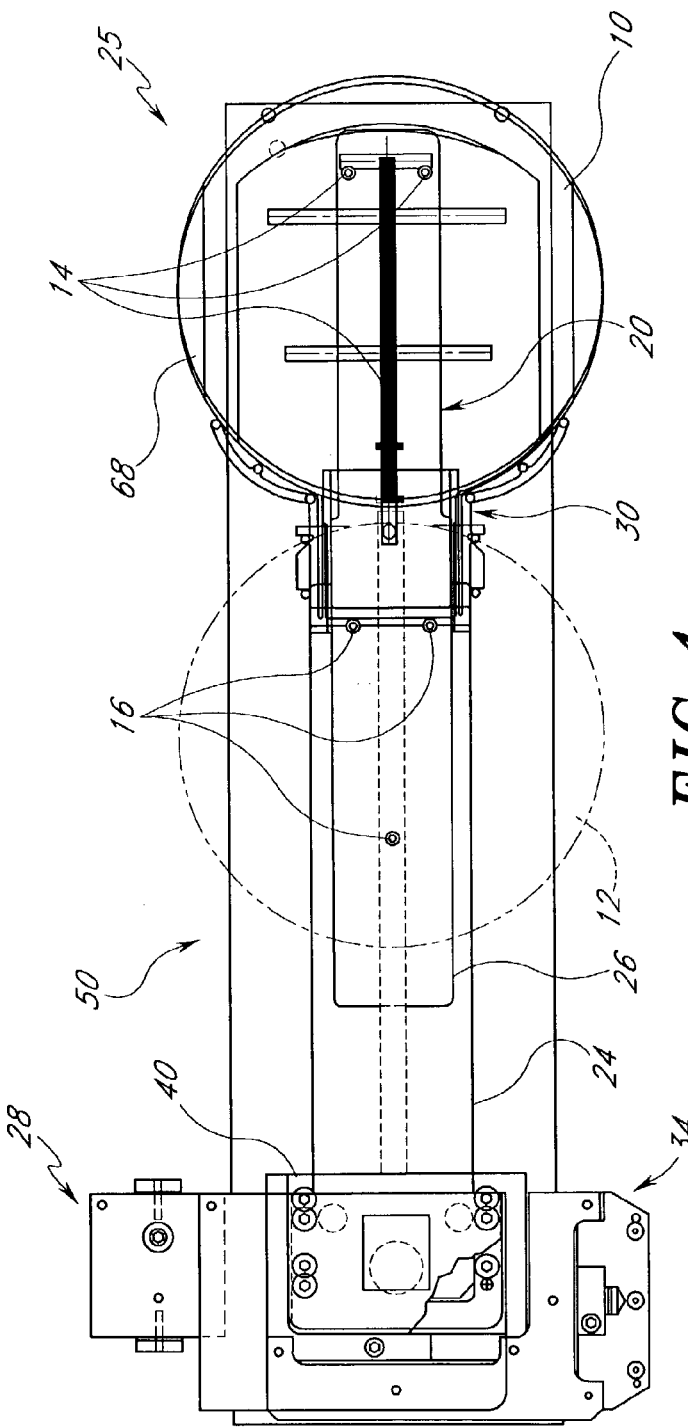
FIG. 4 is a top view of the dual-arm substrate transfer assembly of the present invention.
Figure 5:
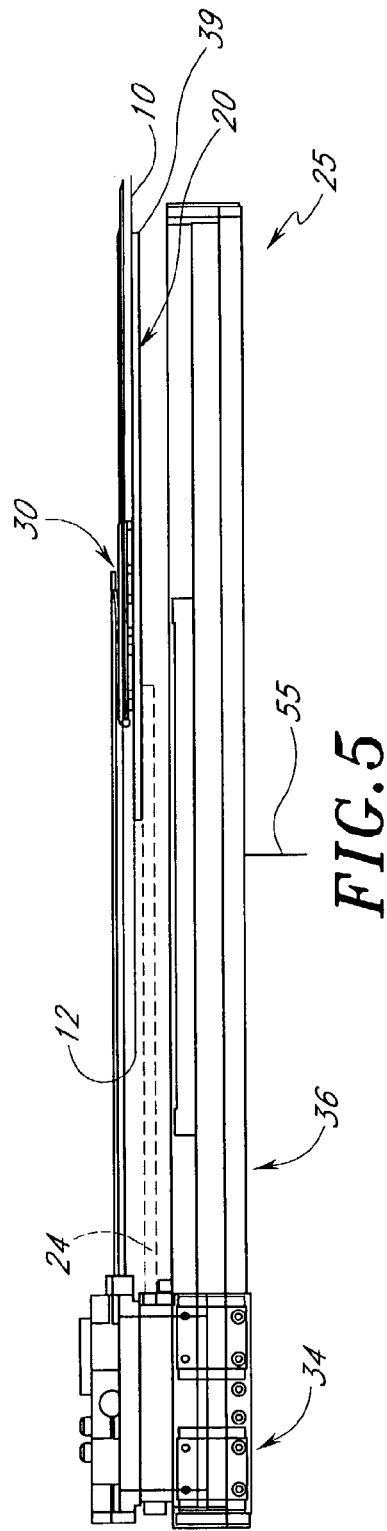
FIG. 5 is a side view of the dual-arm substrate transfer assembly of the present invention.

FIG. 1 provides an isometric view of the wafer processing system in which the present invention operates. As will be described in greater detail below, a wafer handler 50 positioned in a handling chamber 51 preferably operates between two load lock 120, cooling stations 110, and a processing chamber 122. The handler is preferably rotatably mounted on an axis 55 such that it can be rotated to "face" the load lock chamber 120, processing chamber 122, or either one of the two cooling stations 110. The term "face" and its various forms are used herein to describe the orientation of the handler 50 in terms of the position of the port 42 relative to the load lock chamber 120, process chamber 122, and cooling stations 110. Referring now to FIGS. 1, 4, and 5, a dual-arm wafer transfer robot assembly 25 is mounted within the handler 50, and interacts with the process chamber 122, load lock chamber 120, and cooling stations 110 through a port 42 in the handler 50. The dual-arm wafer transfer robot 25 comprises first and second robot arms 20 and 30 respectively, as described below.

Shown in FIGS. 2 and 3, the first robot arm 20 preferably comprises a dual-location paddle-type end effector, a proximal arm portion 24, and a support paddle 26 having a distal free end 39 which extends substantially forward from said arm portion 24. Additionally, the first robot arm 20 preferably comprises support pins 14 for supporting a wafer in a primary position identified by a wafer 10, and support pins 16 for supporting a wafer in a secondary position indicated by a phantom line circle 12. The proximal end of the arm portion 24 is preferably fastened within a manifold bracket 40 which is in turn, mounted to a linearly movable carriage 28 adapted to move along a linear pathway (not shown in FIGS. 2 and 3) generally centrally located in a longitudinal direction within the handler 50. The movement of the first robot arm 20 in relation to the other elements of the system will be described below in more detail with respect to FIGS. 6A–6H.

The first arm 20 is fabricated from materials able to withstand the temperatures typically experienced.

FIGS. 2, 3, 4 and 5 illustrate the dual-location robot arm 20 of the present invention in relation to the second robot arm 30 which is preferably a Bernoulli-type wand which lifts the wafer by using jets of substantially non-reactive gas directed downward toward the upper surface of the wafer to create a reduced pressure region above the wafer. The Bernoulli wand is preferably fabricated from quartz or other material suitable for use in high temperature environments such as the process chamber 122, FIG. 1. The details of the operation and fabrication of the Bernoulli wand 30 are schematically shown and described herein, and reference can also be made to U.S. Pat. No. 5,080,549 which is incorporated herein by reference.

The dual-location paddle 20 and the Bernoulli wand 30 are preferably mounted within the handler 50 such that they translate along intersecting paths. The term 'intersecting paths' is used herein to describe paths of motion which bring the two robot arms 20 and 30 into relative positions allowing for wafers to be transferred, or "handed off," therebetween. In the present embodiment, upper and lower robot arms 30 and 20, respectively, translate along parallel and vertically spaced linear axes to allow for robot arm overlap. Note from FIG. 5 that with the wafer 10 positioned on the free end 39 of the paddle 26 there is a slight gap between the wafer and the Bernoulli wand 30.

The function of the carriages 28 and 34 is described schematically herein, and in greater detail in application Ser. No. 08/784,711 which is incorporated herein by reference. Also, the details regarding the rotational and linear motion systems, are available from Cybeq Systems Inc. of Menlo Park, Calif. Other suitable drive arrangements are apparent to those with skill in this particular art and are described in the above-mentioned patents.

Referring to FIG. 1, the cooling stations 110 preferably comprise a plurality of supports 102 on which a wafer or other substrate can be placed, a lower shower head assembly 104, and an upper shower head assembly (not shown) through which cooling gasses may flow. The gas flowing through the outlet 104 and over the wafer cools the wafer to a temperature at which it can be handled by the paddle 26 and the cassette in the load lock chamber 120. The details and operation of the cooling station are schematically shown and described herein, and reference can also be made to the pending application No. 60/052,263 which is incorporated herein by reference.

FIGS. 6A–6H schematically illustrate a preferred sequence of movement of the robot arms 20 and 30 of the wafer transfer system. As mentioned above, the handler 50 is preferably rotatably mounted on an axis 55 such that it can be rotated to face a load lock chamber 120, a processing chamber 122, or either one of two cooling stations 110. The port 42 of the handling chamber 50 is preferably aligned with similarly sized ports in the load locks and processing chambers 120 and 122, respectively, when the handler 50 is rotated to face that position. A cassette 124 of multiple wafers is positioned within the load lock chamber 120, and may be adjustable in a vertical direction to align a particular wafer with the port 42. A controlling computer (not shown) provides instructions to the motors driving the carriages 34 and 28 to cause arms 20 and 30 to translate along a guideway schematically indicated at 36 in FIG. 6A.

Figure 6A:
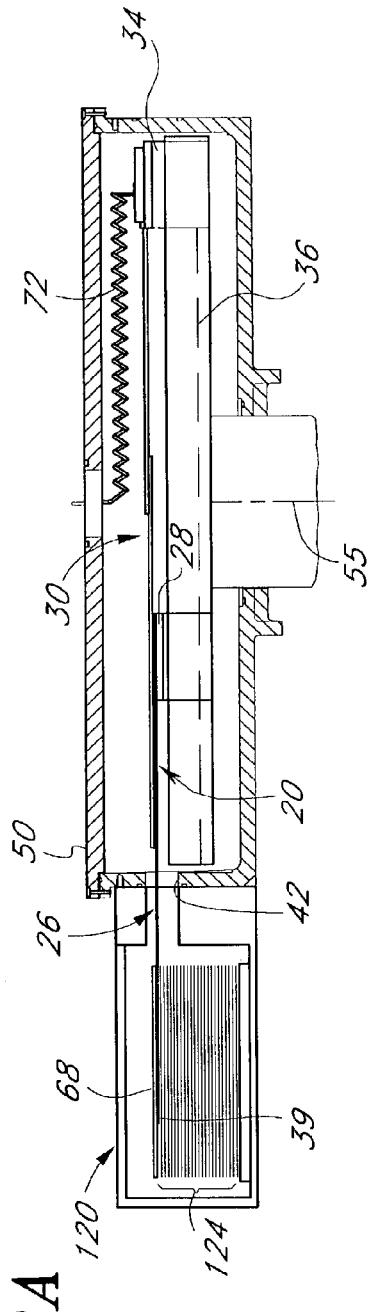

In a first position, as shown in FIG. 6A, the first robot arm 20 translates toward the load lock chamber 120. The free end 39 of the dual-location paddle end effector 26 of the first arm 20 extends through the port 42 and underneath a wafer in the cassette 124 to lift the wafer from the cassette.

Figure 6B:
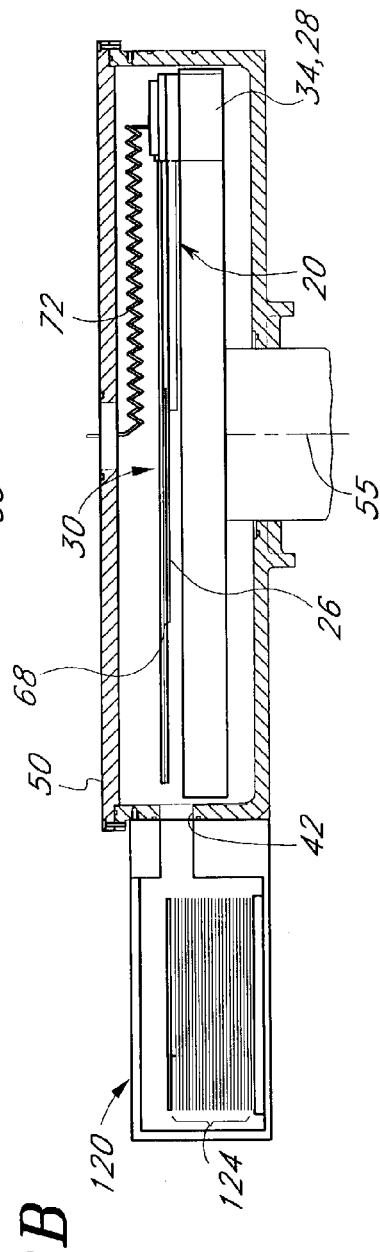

In FIG. 6B, the first robot arm 20 returns to its "home" position which places the wafer 68 directly underneath the Bernoulli wand 30. The wafer can then be transferred to the wand 30, but it is preferable that the handler be rotated to be aligned with the cooling station 110. This avoids the need to insert the paddle partially into the load lock again. Gas flow to the Bernoulli wand is then initiated through the extension hose 72 to enable transfer of the wafer 68 from the paddle 20 to the Bernoulli wand 30 as described above.

Figure 6C:
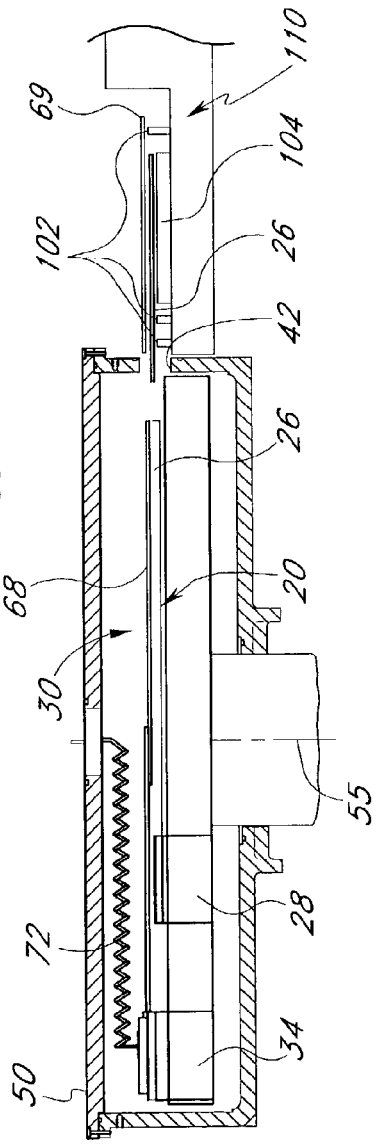

As indicated in FIG. 6C, after the wafer 68 has been lifted by the Bernoulli wand 30, the first robot arm 20 translates partially into the cooling station 120 to a point where the secondary wafer location 12 (FIG. 2) is directly below the wafer 68 being held by the Bernoulli wand 30. The wafer 68 is then deposited onto the paddle 26 at the secondary position 12 by stopping the flow of gas through the Bernoulli wand 30. The paddle is then retracted.

Figure 6D:
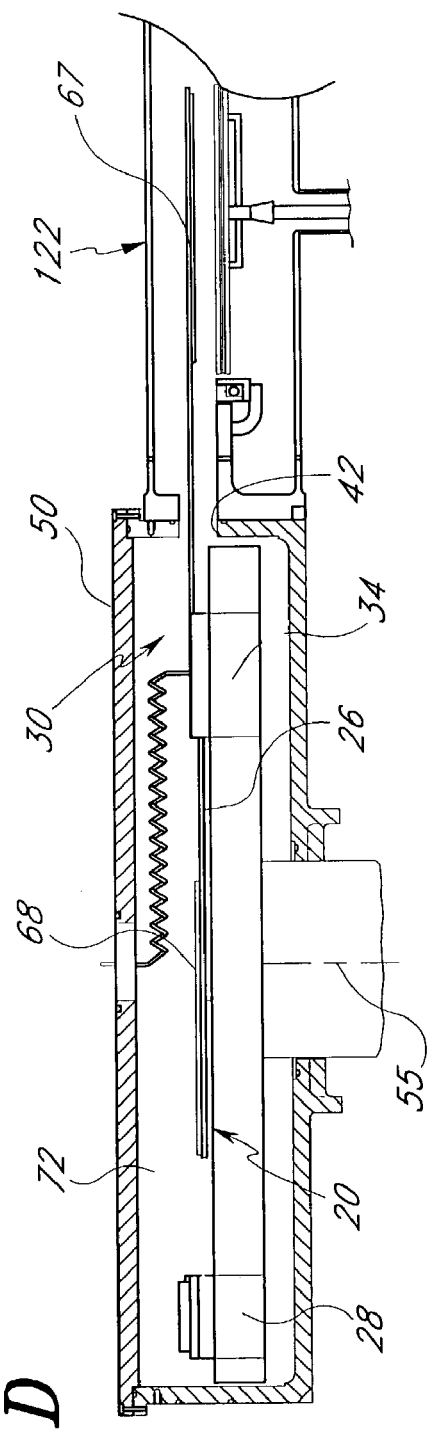
Figure 6E:
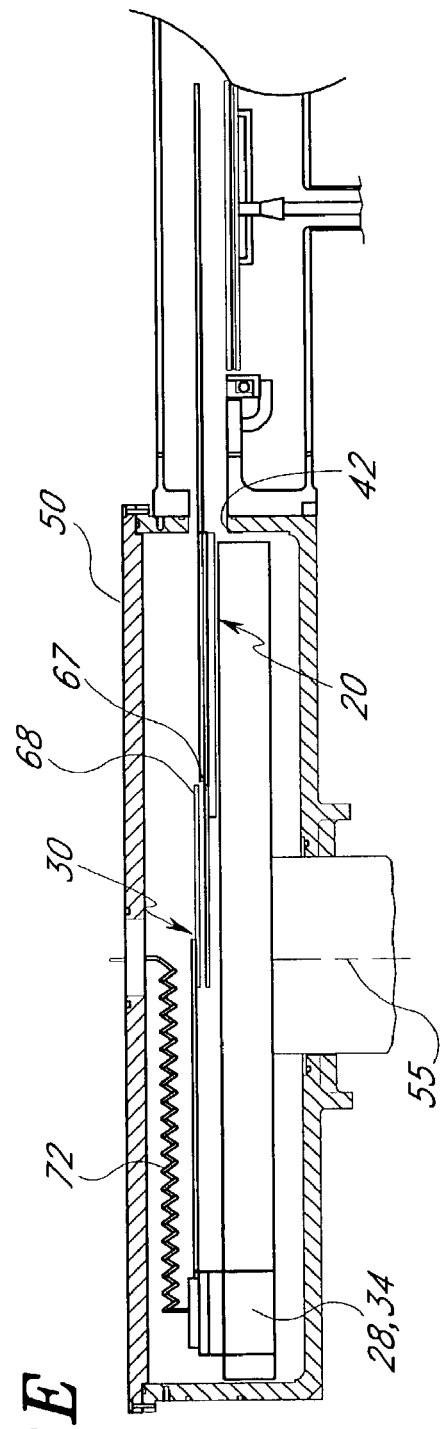

The handler 50 then rotates to a position such that it faces the process chamber 122, as illustrated in FIG. 6D. While facing the process chamber 122, the Bernoulli wand 30 translates forward through the port 42 and into the process chamber 122 to retrieve a "hot" wafer 67 from the support 123 in process chamber 122. The Bernoulli wand 30 then lifts the "hot" wafer 67, translates back to its home position as in FIG. 6E, and deposits the hot wafer onto the paddle primary position 10.

FIG. 6F shows the first robot arm 20 still carrying the hot wafer at position 10 translated toward the process chamber 122 to a position such that the Bernoulli wand 30 is directly above the secondary wafer location 12, FIG. 4. The Bernoulli wand 30 then lifts the wafer 68 from the secondary position 12 and the paddle retracts to the "home" position.

As shown in FIG. 6G, the Bernoulli wand 30 translates toward the process chamber 122 wherein it places the unprocessed wafer 68 on the support 123 for processing.

Finally, as illustrated in FIG. 6H, the handler 50 rotates to face the cooling station 110 where the first robot arm 20 translates into the station and deposits the processed wafer 67. The first robot arm 20 then retracts to its home position in preparation to return the cooled wafer 67 to the load lock 120. The transfer to the load lock is just prior to getting a fresh wafer in primary position 10 on the paddle at the start of the next cycle. This activity of course is occurring while a wafer is being processed, thereby maximizing wafer throughput. As mentioned above, being able to transfer a hot wafer directly from the Bernoulli wand to a paddle requires that the paddle be made of quartz or other material able to withstand the hot wafer.

As an alternate procedure, the hot wafer can be transferred directly to the cooling station by the Bernoulli wand rather than being first transferred to the paddle. The wafer handler then has to be rotated to be aligned with the process chamber before the unprocessed wafer on the paddle can be transferred to the wand for insertion into the process chamber. Thus, while this approach permits the use of a paddle not made of high heat tolerant material, the cycle time is increased.

Although the present invention is particularly suited for transferring wafers to and from the load lock chamber 120, processing chamber 122, and cooling stations 110, it may be positioned in other locations within a deposition processing system where the advantageous attributes disclosed herein would be useful.

Although this invention has been disclosed in the context of certain preferred embodiments and examples, it will be understood by those skilled in the art that the present invention extends beyond the specifically disclosed embodiments or sequences to other alternative embodiments and other sequences or uses of the invention and obvious modifications and equivalents thereof. Thus, it is intended that the scope of the present invention herein disclosed should not be limited by the particular disclosed embodiments described above, but should be determined only by a fair reading of the claims that follow.

What is claimed is:

1. A robot assembly for transferring thin, flat substrates between a first chamber and a hotter second chamber, comprising:
   a first robot arm having a supported end and a free end, said arm having a primary location for supporting a substrate on the free end and a secondary location for supporting a substrate between the free end and the supported end so that two substrates can be supported on the first arm at the same time; said arm being mounted for linear movement from a retracted position to an extended position for moving a substrate into and out of said first chamber; and
   a second robot arm having a supported end and a free end, said second arm having a Bernoulli end effector on its free end, said second arm being mounted for linear movement from a retracted position to an extended position for moving a substrate into and out of the second chamber, said second arm being positioned above said first arm with the supported end of the second arm being substantially directly above the supported end of the first arm when the arms are in their retracted positions;
   said arms being rotatable as a unit to be aligned with an entry to either the first chamber or the second chamber; and
   said arms being movable so that the Bernoulli end effector is directly above said first robot arm primary or secondary locations to enable a substrate positioned on either location to be lifted or released by the Bernoulli end effector, and said arms being movable so that a substrate may be removed from the second chamber and placed on said first arm while a second substrate is on the first arm in position to be transferred into the second chamber by the second arm.

2. The assembly of claim 1 wherein said Bernoulli end effector is above said first arm primary location when the arms are in their retracted positions.

3. The assembly of claim 2 wherein said Bernoulli end effector is above said first arm secondary location when the first arm is partially extended and said second arm is in its retracted position.

4. The assembly of claim 1 wherein said first arm has substrate supports at each of said locations to extend beneath the substrates to support a respective one of the substrates.

5. The assembly of claim 1, wherein said first arm is extendable from a first position to a second position in which the secondary location on the arm occupies the space occupied by the primary location before the arm was extended.

6. The assembly of claim 1, wherein said robot arms are mounted to be linearly movable so as to enable the first robot arm to move a substrate into and out of a load lock chamber and to transfer substrates to the Bernoulli wand end effector, and so as to enable the second robot arm to move substrates into and out of a process chamber.

7. The assembly of claim 1, wherein said first robot arm is mounted to be movable into or out of a cooling station.

8. A robot assembly to be positioned in a substrate handling chamber for transferring thin, flat substrates between a first chamber and a hotter second chamber, said assembly comprising:
   a first robot arm having a supported end and a free end forming a paddle end effector, said arm having a retracted position, said arm being configured to extend the free end beneath a substrate to lift it and retract it into the handling chamber;

a second robot arm having a supported end and a free end forming a Bernoulli end effector adapted to create a low-pressure region above a substrate to lift it;

a primary substrate support being positioned on the free end of the first robot arm and a secondary substrate support positioned between the primary support and a supported end of the first robot arm, said robot arms being movable to a position in which the Bernoulli end effector is positioned directly above a substrate located on the primary support of the first robot arm and the supported end of the second arm is directly above the supported end of the first arm whereby a substrate may be transferred from the first arm to the second arm;

said first arm being extendable with respect to the second arm so as to position the secondary substrate support beneath the Bernoulli end effector to enable the Bernoulli end effector to transfer a substrate to the secondary support on the first robot arm;

said Bernoulli end effector being extendable to move into a process chamber to withdraw a hot substrate from the process chamber into the handling chamber, while a substrate is resting on said secondary position on the paddle end effector.

9. The assembly of claim 8, wherein said Bernoulli end effector is retractable to deposit said hot substrate on said primary position on said paddle.

10. The assembly of claim 9, wherein said first robot arm is extendable towards the process chamber to a position wherein the secondary position of the paddle is beneath the Bernoulli end effector to enable a substrate to be transferred from the first robot arm to the Bernoulli end effector while said hot substrate is on the paddle primary position; and said second robot arm being extendable so that the Bernoulli end effector can deposit a second substrate within the process chamber while the hot wafer remains on said paddle.

11. The assembly of claim 10, wherein said paddle is movable to deposit said hot substrate in a cooling station.

12. The assembly of claim 8, wherein said Bernoulli end effector is moveable to deposit said hot substrate in a cooling station.

13. A method of transferring thin, flat substrates between a first chamber and a hotter second chamber, comprising:

providing a first robot arm having a supported end and a free end, said arm having a primary location for supporting a substrate on the free end and a secondary location for supporting a substrate between the free end and the supported end so that two substrates can be supported on the first arm at the same time;

moving said arm linearly from a retracted position to an extended position for moving a substrate into and out of said first chamber;

providing a second robot arm having a supported end and a free end, said second arm having a Bernoulli end effector on its free end;

moving said second arm linearly from a retracted position to an extended position for moving a substrate into and out of the second chamber;

positioning said second arm above said first arm with the supported end of the second arm being substantially directly above the supported end of the first arm when the arms are in their retracted positions;

rotating said arms as a unit to be aligned with an entry to either the first chamber or the second chamber;

moving said arms so that the Bernoulli end effector is directly above said first robot arm primary or secondary locations to enable a substrate positioned on either location to be lifted or released by the Bernoulli end effector; and moving said arms so that a substrate is removed from the second chamber and placed on said first arm while a second substrate is on the first arm in position to be transferred into the second chamber by the second arm.

14. The method of claim 13 including moving said Bernoulli end effector above said first arm primary location when the arms are in their retracted positions.

15. The method of claim 14 including retracting said Bernoulli end effector above said first arm secondary location when the first arm is partially extended.